United States Patent
Liu et al.

(10) Patent No.: US 11,520,965 B2
(45) Date of Patent: Dec. 6, 2022

(54) PROGRAMMABLE DEVICE WITH PRE-ALLOCATABLE WIRING STRUCTURE

(71) Applicant: HERCULES MICROELECTRONICS CO., LTD., Beijing (CN)

(72) Inventors: Chengli Liu, Beijing (CN); Haili Wang, Beijing (CN); Zixian Chen, Beijing (CN); Ming Ma, Beijing (CN)

(73) Assignee: HERCULES MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 16/769,164

(22) PCT Filed: Jan. 8, 2018

(86) PCT No.: PCT/CN2018/071737
§ 371 (c)(1),
(2) Date: Jun. 2, 2020

(87) PCT Pub. No.: WO2019/114071
PCT Pub. Date: Jun. 20, 2019

(65) Prior Publication Data
US 2021/0224451 A1    Jul. 22, 2021

(30) Foreign Application Priority Data
Dec. 13, 2017 (CN) .......................... 201711329486.3

(51) Int. Cl.
*G06F 30/30* (2020.01)
*G06F 30/347* (2020.01)

(52) U.S. Cl.
CPC .................. *G06F 30/347* (2020.01)

(58) Field of Classification Search
CPC ................................... G06F 30/347
(Continued)

(56) References Cited

U.S. PATENT DOCUMENTS 5,712,579 A * 1/1998 Duong ................. H03K 5/1502
326/101
5,883,526 A * 3/1999 Reddy .............. H03K 19/17736
326/41

(Continued)

FOREIGN PATENT DOCUMENTS

| CN | 1547250 A | 11/2004 |
|---|---|---|
| CN | 101043213 A | 9/2007 |
| CN | 107194075 A | 9/2017 |

OTHER PUBLICATIONS

Xilinx, "XC5200 Series Field Programmable Gate Arrays datasheet, v5.2", Nov. 1998 (Year: 1998).*

(Continued)

*Primary Examiner* — Jack Chiang
*Assistant Examiner* — Brandon Bowers
(74) *Attorney, Agent, or Firm* — Buchanan, Ingersoll & Rooney PC

(57) ABSTRACT

A programmable device includes a functional module, a pre-allocation manager, a first connection line, and a second connection line, wherein the pre-allocation managers are connected by the first connection lines, and the pre-allocation managers are connected to the functional modules by the second connection lines; the first connection lines are used for data transmission between the pre-allocation mangers, and a transmission direction is determined according to the configuration; the second connection lines are used for data transmission between the pre-allocation managers and the functional modules; the pre-allocation mangers are used for data transmission between the first connection lines and for data transmission between the first connection lines and the functional modules. The first connection lines are configured as connection line segments for transmission in both (Continued)

directions, and a wiring structure is designed in a direction and shape meeting wiring requirements.

7 Claims, 7 Drawing Sheets

(58) Field of Classification Search
USPC .......................................................... 716/128
See application file for complete search history.

(56) References Cited

U.S. PATENT DOCUMENTS

| | | | | |
|---|---|---|---|---|
| 6,229,337 | B1* | 5/2001 | Xiao | H03K 19/17728 326/38 |
| 6,975,139 | B2* | 12/2005 | Pani | H03K 17/002 326/101 |
| 9,859,896 | B1* | 1/2018 | Gaide | H03K 19/17728 |
| 2006/0164120 | A1* | 7/2006 | Verma | H03K 19/17736 326/41 |

OTHER PUBLICATIONS

International Search Report (with English Translation) and Written Opinion issued in corresponding International Patent Application No. PCT/CN2018/071737, 9 pages (dated Sep. 17, 2018).

* cited by examiner

PROGRAMMABLE DEVICE WITH PRE-ALLOCATABLE WIRING STRUCTURE

BACKGROUND OF THE INVENTION

Technical Field

The invention relates to the field of programmable devices, in particular to a programmable device with a pre-allocatable wiring structure.

Description of Related Art

Traditional programmable devices typically consist of a logic unit array and a wiring structure. FIG. 1 is a schematic diagram of a 4*4 programmable device. In FIG. 1, each functional module 4 comprises a routing block (RB) and a logic block (LB), wherein the RB consists of a plurality of multiplexers (mux) with different bit widths, and the LB consists of a plurality of lookup tables, registers and adders. Connection lines 1 that connect every two RBs in the vertical direction have a direction from south to north or from north to south and a length crossing 1-18 RB+LB. Connection lines 3 that connect every two RBs in the horizontal direction have a direction from east to west or from west to east and a length crossing 1-18 RB+LB. The RB and the LB in the same functional module are connected by means of a connection line 2.

Because of the fixed wiring structure, traditional FPGAs have a redundancy over 50% and have the defects of excessively large area, excessively high power consumption and too many metal layers. The traditional FPGAs have the advantages of sufficient connection lines between adjacent RBs, simple connection structure and small delay.

The reasons for too many metal layers in the RBs are as follows:

1. The connection lines extend eastward, westward, southward and northward. In many FPGA test cases, it indicates that the connection lines in the four directions need to be configured between several adjacent RBs, and the numbers of the lines in the four directions are approximately the same. The proportion of the connection lines between over eight RBs varies drastically, and the directions of the connection lines are almost identical. This will result in a large quantity of long connection lines in the FPGAs and a redundancy of 50%.

2. With a line crossing eight RBs as an example, if each RB has a long line crossing eight RBs in one direction, this line will occupy eight metal tracks in one RB.

The traditional architecture restricts the fabrication of larger devices and higher running speeds.

BRIEF SUMMARY OF THE INVENTION

The objective of the invention is overcome the aforesaid defects of the prior art by replacing long lines (crossing three or more RBs), that can only connect two or more points, of traditional wiring structures with long lines that can cross a pre-allocatable number of RBs and can have pre-allocatable directions and shapes.

To fulfill the above objective, the invention provides a programmable device with a pre-allocatable wiring structure, in one aspect. The programmable device comprises at least one functional module, at least one pre-allocation manager, at least one connection line and at least one second connection line, wherein the pre-allocation managers are connected by means of the first connection lines, and the pre-allocation managers are connected to the functional modules by means of the second connection lines; the first connection lines are used for data transmission between the pre-allocation managers, and transmission directions of the first connection lines are determined according to the configuration; the second connection lines are used for data transmission between the pre-allocation managers and the functional modules; and the pre-allocation managers are used for data transmission between the first connection lines and the functional modules and for data transmission between the first connection lines.

Preferably, the pre-allocation manager comprises a plurality of multiplexers mux, wherein each mux has a plurality of input terminals and a plurality of output terminals; the plurality of input terminals of each mux include at least one directional input port connected to the first connection lines in multiple directions and at least one first common connection line port connected to a first common connection line in the second connection line, and the first common connection line is used for data transmission from the functional module to the pre-allocation manager; the plurality of output terminals of each mux include at least one directional output port connected to the first connection line in one direction and at least one second common connection line port connected to a second common connection line in the second connection line, and the second common connection line is used for data transmission from the pre-allocation manager to the functional module; and the directions of the first connection lines connected to the output terminals of each mux are different from the direction of the first connection line connected to the input terminal of the mux, and the directions of the first connection lines connected to the output terminals of the plurality of mux are different.

Preferably, the pre-allocation manager is used for data transmission between the first connection line and the functional module, particularly: data from the first connection line is transmitted to the pre-allocation manager via one directional input port of one mux, then the pre-allocation manager transmits the data to the second connection line via the second common connection line port of the same mux, and the second connection line transmits the data to the functional module.

Preferably, the pre-allocation manager is used for data transmission between the first connection line and the functional module, particularly: data from the functional module is transmitted to the second connection line, then the second connection line transmits the data to the pre-allocation manager via the first common connection line port of one mux, and the pre-allocation manager transmits the data to the first connection line via the directional output port of the same mux.

Preferably, the pre-allocation manager is used for data transmission between the first connection lines, particularly: data from one first connection line is transmitted to the pre-allocation manager via one directional input port of one mux, and then the pre-allocation manager transmits the data to another first connection line via the directional output port of the same mux.

In the embodiments of the invention, connection lines between functional units are configured as connection line segments used for transmission in both directions, a wiring structure is designed in a direction and shape meeting wiring requirements, and the number of RBs crossed by long lines is changed to a random number from a fixed number, so that the number of metal layers of LBs is reduced.

DETAILED DESCRIPTION OF THE INVENTION

The technical solution of the invention is further expounded below in combination with the accompanying drawings and embodiments.

Figure 1:
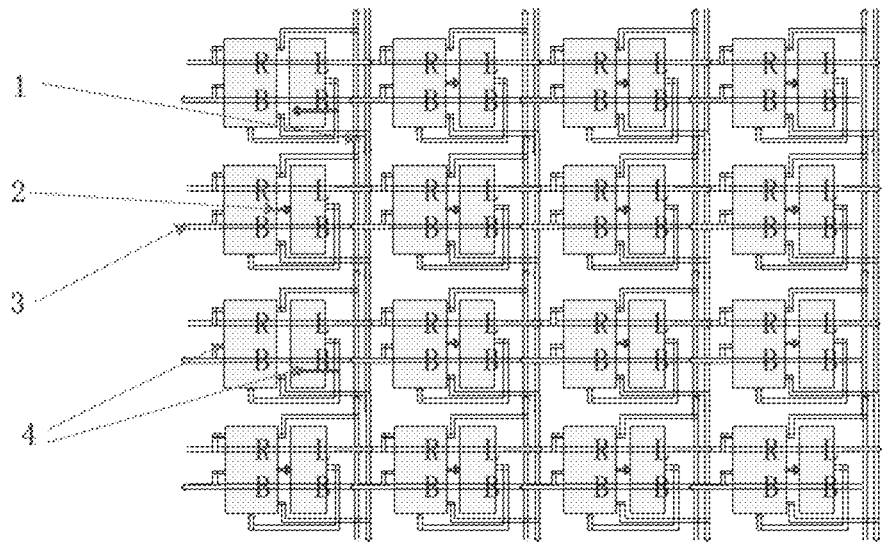
FIG. 1 is a schematic diagram of a wiring structure of a programmable device in the prior art.
Figure 2:
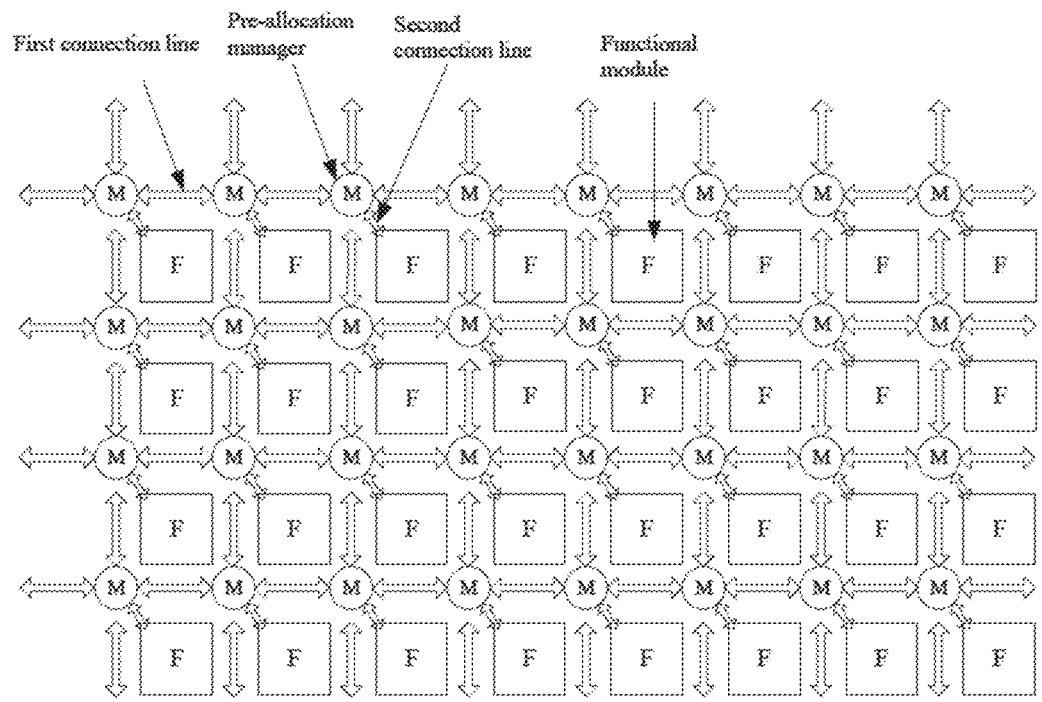
FIG. 2 is a schematic diagram of a wiring structure in an embodiment of the invention.

FIG. 2 is a schematic diagram of a wiring structure in an embodiment of the invention. As shown in FIG. 2, the wiring structure comprises at least one functional module F, at least one pre-allocation manager M, at least one first connection line, and at least one second connection line. The pre-allocation managers are connected by means of the first connection lines, and the pre-allocation managers are connected to the functional modules by means of the second connection lines; the first connection lines are used for data transmission between the pre-allocation managers and can transmit data in both directions, and the data transmission direction of each connection line can be changed according to the configuration; the second connection lines are used for data transmission between the pre-allocation managers and the functional modules and may adopt conventional connection lines; and the pre-allocation managers are used for data transmission between the first connection lines and the functional modules and for data transmission between the first connection lines.

Figure 3:
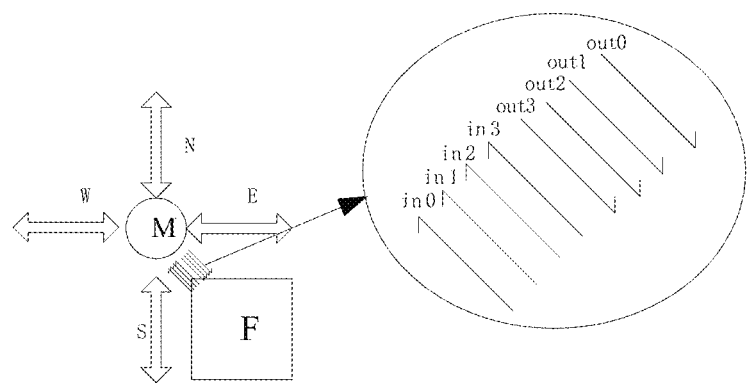
FIG. 3 is a connection diagram of a pre-allocation manager and a functional module.

FIG. 3 is a connection diagram of connection lines between the pre-allocation mangers M and the functional modules F. One pre-allocation manager M is connected to multiple first connection lines and one second connection line. For example, as shown in FIG. 3, one pre-allocation manager M is connected to four first connection lines in four directions which are respectively marked as direction "N", direction "S", direction "W" and direction "E", connection ports of the four first connection lines on the pre-allocation manager M are referred to as directional ports which are respectively marked as port "N", port "S", port "W" and port "E". It should be noted that there may be more than one connection line in each direction, and the data transmission direction of each connection line can be changed according to the configuration.

Each second connection line consists of a plurality of common connection lines with directional attributes. For example, as shown in FIG. 3, the second connection line consists of eight common connection lines with directional attributes, wherein four of the eight common connection lines are used for data transmission from the functional module to the pre-allocation manager, and connection ports of these four common connection lines on the pre-allocation manager are referred to as first common connection line ports which are respectively marked as port in0, port in1, port in2 and port in3; and the other four common connection lines are used for data transmission from the pre-allocation manager to the functional module, and connection ports of these four common connection lines on the pre-allocation manager are referred to as second common connection line ports which are respectively marked as port out0, port out1, port out2 and port out3.

Figure 4:
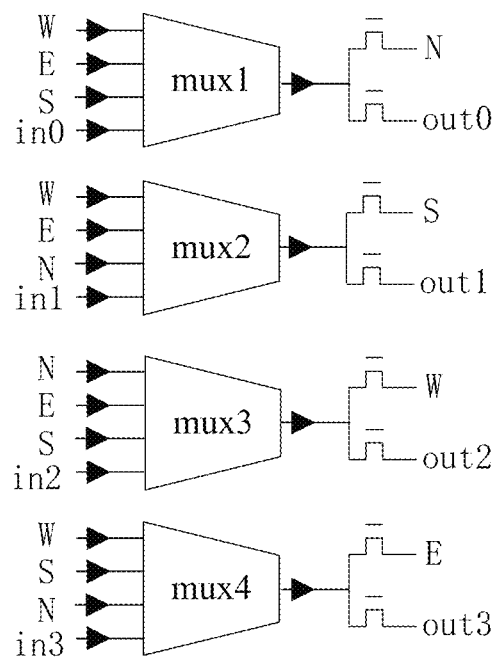
FIG. 4 is an internal structural diagram of the pre-allocation manager.

FIG. 4 is an internal structural diagram of the pre-allocation manager. As shown in FIG. 4, each pre-allocation manager is internally provided with a plurality of multiplexers (mux) such as four mux, wherein each mux has four input terminals and two output terminals. The four input terminals of each mux include three directional ports and one first common connection line port, wherein the three directional ports of the input terminals are marked as directional input ports which are respectively connected to the first connection lines in three of the four directions in FIG. 3; the first common connection line port is connected to one first common connection line in the second connection line in FIG. 3. The two output terminals of each mux include one directional port and one second common connection line port, wherein the directional port of the output terminal is marked as a directional output port which is connected to the first connection line in one direction in FIG. 3, and the second common connection line port is connected to one second common connection line in the second connection line in FIG. 3.

The directions of the first connection lines connected to the output terminals of each mux are different from the direction of the first connection line connected to the input terminal of the mux. For example, in FIG. 4, the directional input ports of mux1 are connected to the first connection line in direction "W", the first connection line in direction "E", and the first connection line in direction "S", and the directional output port of mux1 is connected to the first connection line in direction "N".

The directions of the first connection lines connected to the output terminals of the four mux are different. For example, as shown in FIG. 4, the directional output port of mux1 is connected to the first connection line in direction "N", the directional output port of mux2 is connected to the first connection line in direction "S", the directional output port of mux3 is connected to the first connection line in direction "W", and the directional output port of mux4 is connected to the first connection line in direction "E".

Figure 5A:
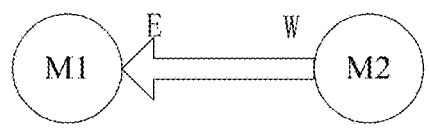
FIG. 5A is a schematic diagram of data transmission in one direction of a first connection line.
Figure 5B:
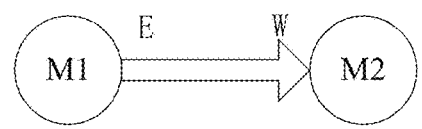
FIG. 5B is a schematic diagram of data transmission in another direction of first connection line.

The first connection lines are programmable connection lines. In FIG. 2, one first connection line is connected to two pre-allocation managers M; in the absence of program control, the first connection lines no directional attributes; in the presence of program control, the first connection lines will be turned on in one direction, that is, data can only be transmitted from one pre-allocation manager to another pre-allocation manager. For example, as shown in FIG. 5A and FIG. 5B, data can only be transmitted from M2 to M1 or from M1 to M2. In FIG. 5A, port "E" of M1 is given an input attribute to serve as a directional input port, and port "W" of M2 is given an output attribute to serve as a directional output port.

In one pre-allocation manager, when data in one functional module is transmitted to the first connection lines via the pre-allocation manager, four first common connection lines in the second connection line are in one-to-one correspondence with the first connection lines in the four directions. For example, as shown in FIG. 4, data can be transmitted to the pre-allocation manager via port in0 and are then transmitted to the first connection line in direction "N" via port "N"; data can be transmitted to the pre-allocation manager via port in1 and are then transmitted to the first connection line in direction "S" via port "S"; data can be transmitted to the pre-allocation manager via port in2 and are then transmitted to the first connection line in direction "W" via port "W"; and data can be transmitted to the pre-allocation manager via port in0 and are then transmitted to the first connection line in direction "E" via port "E".

In one pre-allocation manager, when data from the first connection lines is transmitted to the functional module via the pre-allocation manager, data from the first connection line in a certain direction can be transmitted to the functional module via any one of the three second common connection line ports, and the pre-allocation manager will randomly select one second common connection line port to transmit the data. For example, as shown in FIG. 4, data from the first connection line in direction "S" is transmitted to the functional module via port out0 after mux1 of the pre-allocation manager is gated; data from the first connection line in direction "N" is transmitted to the functional module via port out1 after mux2 of the pre-allocation manager is gated; data from the first connection line in direction "E" is transmitted to the functional module via port out2 after mux3 of the pre-allocation manager is gated; and data from the first connection line in direction "W" is transmitted to the functional module via port out3 after mux4 of the pre-allocation manager is gated.

In one pre-allocation manager, when data from one first connection line is transmitted to another first connection line via the pre-allocation manager, the data is transmitted to the pre-allocation manager via the corresponding directional input port and is then transmitted to another first connection line via the corresponding directional output port.

Figure 6:
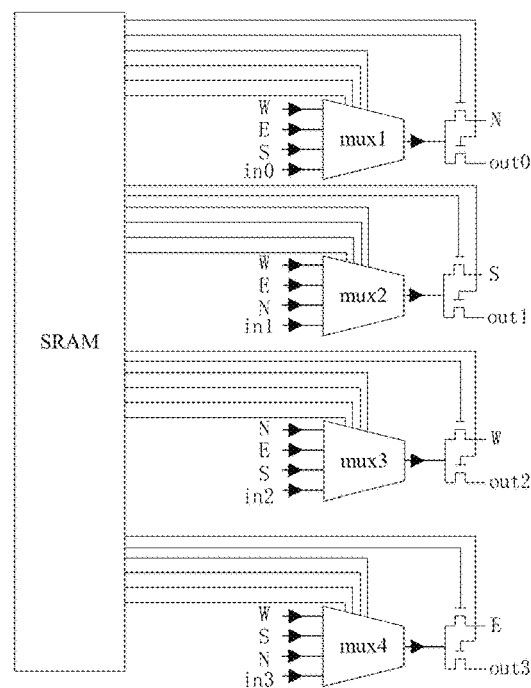
FIG. 6 is a connection diagram of an SRAM and the pre-allocation manager.

The programmable device further comprises a static registor array memory (SRAM), wherein the SRAM may include 24 control lines which are divided into four groups, each group of control lines controls one mux and include six control lines, and each group is divided into an input control line group including four control line which respectively control gating of the four input ports, for example, by means of one-hot codes, and an output control line group including two control lines which respectively control gating of the two output ports by means of one-hot codes. For example, as shown in FIG. 6, the corresponding one-hot codes for gating port "W", port "E", port "S" and port in0 at the input terminals of mux1 are respectively 1000, 0100, 0010 and 0001, and when port in0 is gated, a status code of the input control line group is 0001; and the corresponding on-hot codes for gating port "N" and port out0 at the output terminals are respectively 10 and 01.

The pre-allocation managers have three working statuses: data is transmitted from the functional modules to the first connection lines by means of the pre-allocation managers, data is transmitted from one first connection line to another first connection line by means of the pre-allocation managers, and data is transmitted from the first connection lines to the functional modules by means of the pre-allocation managers. The three working statuses of the pre-allocation managers are further explained below with reference to the accompanying drawings and embodiments. To highlight the key points of the invention, the SRAM is not shown in the following figures, and turn-on circuits and modules are illustrated in bold.

Figure 7A:
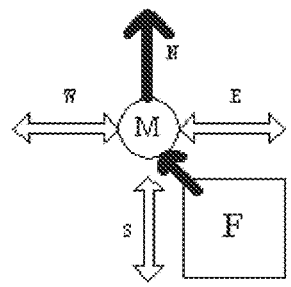
FIG. 7A is a circuit diagram of data transmission from the functional module to the first connection line.
Figure 7B:
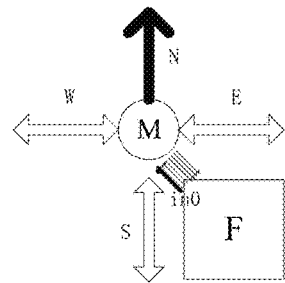
FIG. 7B is a circuit diagram of a second connection line when data is transmitted from the functional module to the first connection line.
Figure 7C:
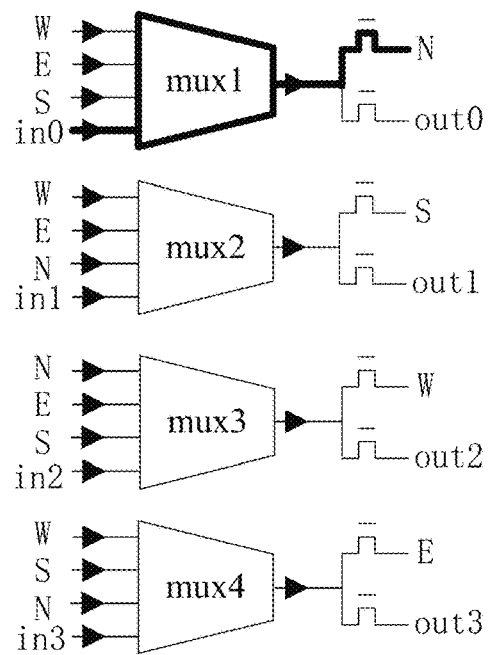
FIG. 7C is a circuit diagram of the pre-allocation manager when data is transmitted from the functional module to the first connection line.

FIG. 7 shows a circuit for transmitting data from one functional module to first connection lines. In FIG. 7A, data is transmitted from the functional module to the first connection line in direction "N". In FIG. 7B, the common connection line, for example corresponding to port in0, in the second connection line is turned on. In conjunction with FIG. 4, mux1 is selected, and an input of port in0 and an output of port "N" are gated, so that data is transmitted from the functional module to the first connection line in direction "N". The actual working process is as follows: the functional module output data which in turn is transmitted to the pre-allocation manager by means of the common connection line, corresponding to port in0, in the second connection line, and then the pre-allocation manager transmits the data to the first connection line in direction "N". The connection line that is specifically turned on in the pre-allocation manager is shown in FIG. 7C.

Figure 8A:
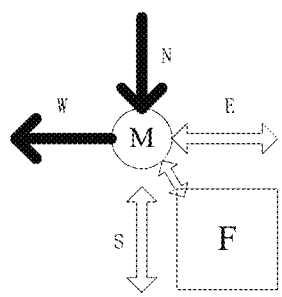
FIG. 8A is a circuit diagram of data transmission from one first connection line to another first connection line.
Figure 8B:
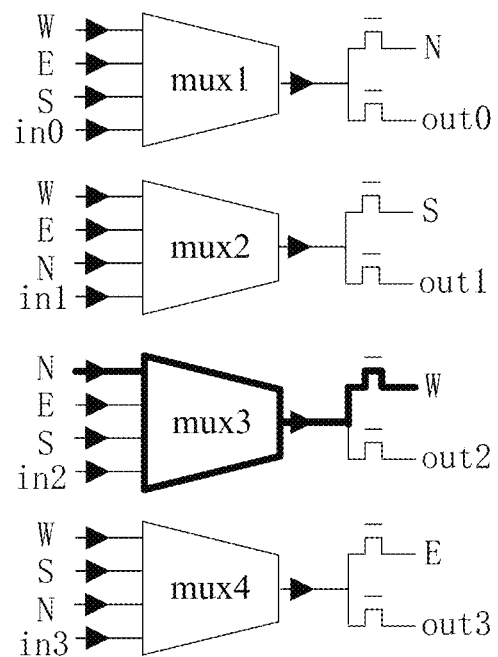
FIG. 8B is a circuit diagram of the pre-allocation manager when data is transmitted from one first connection line to another first connection line.

FIG. 8 shows a circuit for transmitting data from one first connection line to another first connection line. As shown in FIG. 8A, data is transmitted from the first connection line in direction "N" to the first connection line in direction "W". In conjunction with FIG. 4, mux3 is selected, and an input of port "N" and an output of port "W" are gated, so that data is transmitted from the first connection line in direction "N" to the first connection line in direction "W". The actual working process is as follows: the first connection line in direction "N" outputs data which is in turn transmitted to the pre-allocation manager via port "N", and then the pre-allocation manager transmits the data to the first connection line in direction "W". The connection line that is specifically turned on in the pre-allocation manager is shown in FIG. 8B.

Figure 9A:
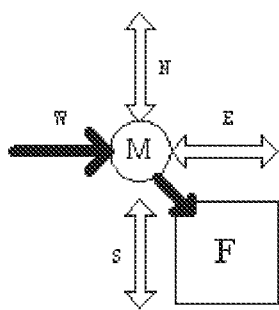
FIG. 9A is a circuit diagram of data transmission from the first connection line to the functional module.
Figure 9B:
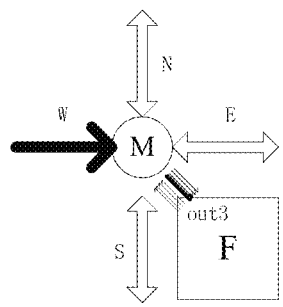
FIG. 9B is a circuit diagram of the second connection line when data is transmitted from the first connection line to the functional module.
Figure 9C:
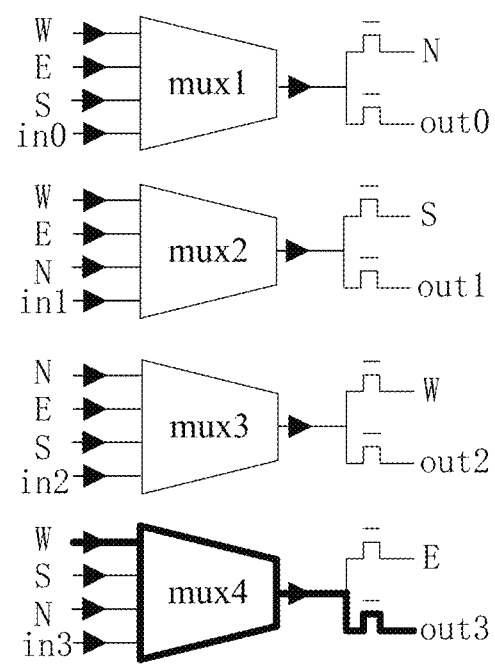
FIG. 9C is a circuit diagram of the pre-allocation manger when data is transmitted from the first connection line to the functional module.

FIG. 9 shows a circuit for transmitting data from one first connection line to one functional module. In FIG. 9A, data is transmitted to the first connection line in direction "W" to the functional module. In FIG. 9B, the common connection line, corresponding to port out3, in the second connection line is turned on. In conjunction with FIG. 4, mux4 is selected, and an input of port "W" and an output of port out3 are gated, so that data is transmitted from the first connection line in direction "W" to the functional module. The actual working process is as follows: the first connection line in direction "W" transmits data to the pre-allocation manager which in turn transmits the data to the functional module by means of the common connection line, corresponding to port out3, in the second connection line. The connection line that is specifically turned on in the pre-allocation manager is shown in FIG. 9C.

Figure 10A:
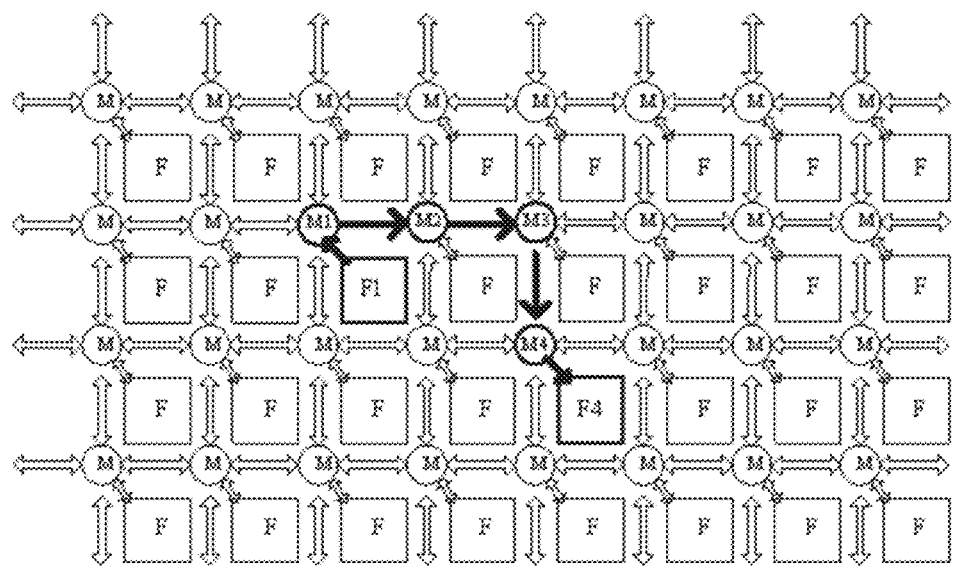
FIG. 10A is a circuit diagram of data transmission from one functional module to another functional module.
Figure 10B:
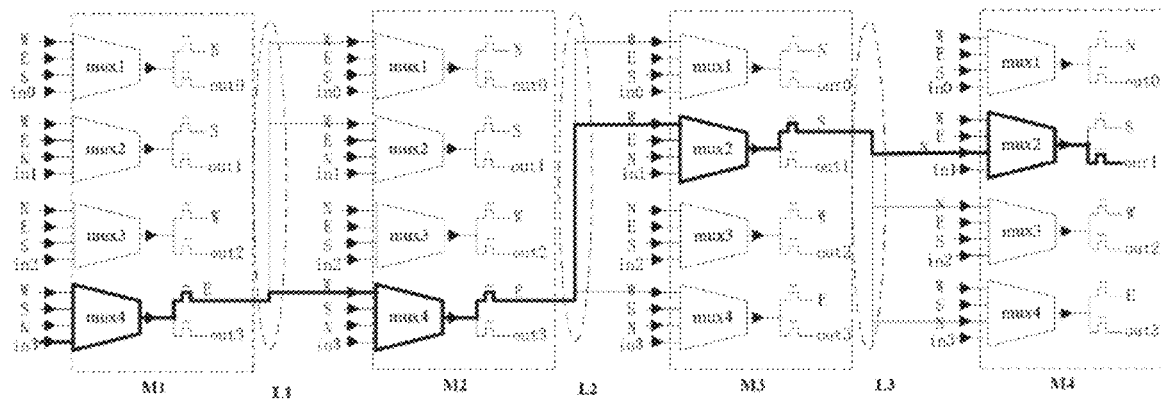
FIG. 10B is a circuit diagram of the pre-allocation manager when data is transmitted from one functional module to another functional module.

FIG. 10 shows a circuit for transmitting data from one functional module to another functional module. In FIG. 10A, the functional module F1 transmits data to the functional module F4 by means of the corresponding first connection lines shown in FIG. 10B. The working process is as follows: the functional module F1 transmits data to mux4 of the pre-allocation manager M1 by means of the common connection line, corresponding to port in3, in the second connection line, and then the data is transmitted to the first connection line L1 between M1 and M2 via port "E" of mux4; M1 transmits the data to the pre-allocation manager M2 by means of the first connection line L1, and as for the pre-allocation manager M2, data is transmitted from direction "W" and will be transmitted towards direction "E"; the data enters mux4 via port "W" of mux4 in M2 and is then transmitted to the first connection line L2 between M2 and M3 via port "E" of mux4; M2 transmits the data to the pre-allocation manger M3 by means of the first connection line L2, and as for the pre-allocation manager M3, data is transmitted from direction "W" and will be transmitted towards direction "S"; the data enters mux2 via port "W" of mux2 in M3 and is then transmitted to the first connection line L3 between M3 and M4 via port "S" of mux2; when M3 transmits the data to the pre-allocation manager M4 by means of the first connection line L3, the data is transmitted to the pre-allocation manager M4 from direction "N" and will be transmitted from the pre-allocation manager toward the functional module; and the data enters mux2 from via port "N" at the input terminal of M4 and is then transmitted to the functional module F4 by means of one common connection line, corresponding to port out1, in the second connection line.

In the embodiment shown in FIG. 10, data is transmitted from the functional module F1 to the functional module F4 by means of a long line which crosses four RBs, and the number of the RBs crossed by the long line is determined according to the number of the pre-allocation managers crossed by the long line; the number of pre-allocation managers crossed by the long line is random to meet different design requirements, so that the number of RBs crossed by the long line is also random; the novel wiring structure is formed by a plurality of first connection lines, the data transmission direction of the first connection lines can be changed according to the configuration; and during wiring, the first connection lines can be combined randomly in any shape to transmit data from any functional module to another functional module.

The objectives, technical solutions and advantages of the invention are further expounded in the aforesaid specific implementations. It should be understood that the aforesaid implementations are only specific ones, and are not intended to limit the protection scope of the invention. Any modifications, equivalent substitutions and improvements made on the basis of the spirit and principle of the invention should also fall within the protection scope of the invention.

What is claimed is:

1. A programmable device with a pre-allocatable wiring structure, comprising:

a plurality of functional modules arranged in arrays, comprising a first functional module and a second functional module;

a plurality of pre-allocation managers arranged in an array, wherein each of the plurality of pre-allocation managers are connected to another one of the plurality of pre-allocation managers by a first connection line of a plurality of first connection lines, wherein each of the plurality of pre-allocation managers is arranged in a neighborhood of a corresponding one of the plurality of functional modules and is connected thereto by a second connection line;

wherein the plurality of pre-allocation managers include a first pre-allocation manager arranged between a second pre-allocation manager and a third pre-allocation manager, such that the second pre-allocation manager is configured to communicate with the third pre-allocation manager, through the first pre-allocation manager, without communicating through any of the functional modules between the second and third pre-allocation managers, wherein the pre-allocation managers are configured to program and change each of the first connection lines from having bi-directional attributes into having uni-directional attributes, so as to enable a uni-directional data transmission from the first functional module to the second functional module or from the second functional module to the first functional module, wherein when one of the first connection lines has bi-directional attributes, data can be transmitted in two directions through the one of the first connection lines, and wherein when the one of the first connection lines has uni-directional attributes, data can be transmitted in only one direction through the one of the first connection lines.

2. The programmable device according to claim 1, wherein at least one of the pre-allocation managers includes a plurality of multiplexers (mux), and each mux has a plurality of input terminals and a plurality of output terminals, wherein:

the plurality of input terminals of each mux comprises at least one directional input port connected to the first connection lines in multiple directions and at least one first common connection line port connected to a first common connection line in the second connection line, and the first common connection line is configured for data transmission from the functional module to the at least one of the pre-allocation managers;

the plurality of output terminals of each mux include at least one directional output port connected to one of the first connection lines in one direction and at least one second common connection line port connected to a second common connection line in the second connection line, and the second common connection line is configured for data transmission from the at least one of the pre-allocation managers to the functional module; and directions of the first connection lines connected to the output terminals of each mux are different from a direction of the first connection line connected to the input terminal of the mux, and directions of the first connection lines connected to the output terminals of the plurality of mux are different.

3. The programmable device according to claim 2, wherein the at least one of the pre-allocation managers is configured for data transmission between at least one of the first connection lines and the at least one functional module, such that:

data from the at least one of the first connection lines is transmitted to the at least one of the pre-allocation managers via one said directional input port of one mux, then the at least one of the pre-allocation managers transmits the data to the second connection line via the second common connection line port of the same mux, and the second connection line transmits the data to the at least one functional module.

4. The programmable device according to claim 2, wherein the at least one of the pre-allocation managers is configured for data transmission between the at least one of first connection lines and the at least one functional module, such that:

data from the at least one functional module is transmitted to the second connection line, then the second connection line transmits the data to the at least one of the pre-allocation managers via the first common connection line port of one mux, and the at least one of the pre-allocation managers transmits the data to the at least one first connection line via the directional output port of the same mux.

5. The programmable device according to claim 2, wherein the at least one of the pre-allocation managers is configured for data transmission between the first connection lines, such that:

data from one first connection line of the first connection lines is transmitted to the at least one of the pre-allocation managers via one said directional input port of one mux, and then the at least one of the pre-allocation managers transmits the data to another first connection line of the first connection lines via the directional output port of the same mux.

6. The programmable device according to claim 1, wherein, between the pre-allocation managers, the first connection lines are configured only for data transmission.

7. The programmable device according to claim 1, wherein the first connection lines are configurable to have a one-way conduction property.

* * * * *